United States Patent
Sterrett et al.

(10) Patent No.: US 7,592,704 B2
(45) Date of Patent: Sep. 22, 2009

(54) ETCHED INTERPOSER FOR INTEGRATED CIRCUIT DEVICES

(75) Inventors: Terry L. Sterrett, Cave Creek, AZ (US); Devendra Natekar, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 12/169,542

(22) Filed: Jul. 8, 2008

(65) Prior Publication Data

US 2008/0265391 A1  Oct. 30, 2008

Related U.S. Application Data

(62) Division of application No. 10/924,396, filed on Aug. 23, 2004, now Pat. No. 7,413,995.

(51) Int. Cl.
*H01L 23/053* (2006.01)
*H01L 23/48* (2006.01)

(52) U.S. Cl. .............. 257/774; 257/701; 257/723; 257/737; 257/E23.011

(58) Field of Classification Search ........... 257/737, 257/778, 686, 774, 701, 723, E23.011
See application file for complete search history.

(56) References Cited

U.S. PATENT DOCUMENTS

| | | | |
|---|---|---|---|
| 5,177,594 A * | 1/1993 | Chance et al. | ............. 257/678 |
| 5,321,583 A | 6/1994 | McMahon | |
| 6,095,823 A | 8/2000 | Banks | |
| 6,245,594 B1 * | 6/2001 | Wu et al. | ............. 438/108 |
| 6,255,740 B1 | 7/2001 | Tsuji et al. | |
| 6,294,407 B1 | 9/2001 | Jacobs | |
| 6,319,829 B1 | 11/2001 | Pasco et al. | |
| 6,372,620 B1 | 4/2002 | Oosawa et al. | |
| 6,451,627 B1 | 9/2002 | Coffman | |
| 6,469,908 B2 | 10/2002 | Patel et al. | |
| 6,528,874 B1 | 3/2003 | Iijima et al. | |
| 6,548,328 B1 * | 4/2003 | Sakamoto et al. | ........... 438/121 |
| 6,586,684 B2 | 7/2003 | Frutschy et al. | |
| 6,589,870 B1 | 7/2003 | Katoh | |

(Continued)

OTHER PUBLICATIONS

CHIPSUPPLY.COM, "Chip Scale Packaging (CSP)", [online], [retrieved on Apr. 22, 2004], retrieved from the Internet at <URL: http://www.chipsupply.com/corporate/interconnect%20solutions/chip%20scale.htm>.

(Continued)

*Primary Examiner*—Nitin Parekh
(74) *Attorney, Agent, or Firm*—Konrad Raynes & Victor LLP

(57) ABSTRACT

In one embodiment, a package-to-package stack is assembled comprising a first integrated circuit package, and a second integrated circuit package which are mechanically and electrically connected using an interposer. In one embodiment, the interposer 106 includes columnar interconnects which may be fabricated by etching a conductive member such as copper foil, for example. In one application, the pitch or center to center spacing of the columnar interconnects may be defined by masking techniques to provide an interconnect pitch suitable for a particular application. In yet another aspect, etching rates may be controlled to provide height to width aspect ratios of the columnar interconnects which are suitable for various applications.

19 Claims, 9 Drawing Sheets

U.S. PATENT DOCUMENTS

| | | | |
|---|---|---|---|
| 6,617,236 | B2 | 9/2003 | Oosawa et al. |
| 6,646,337 | B2 | 11/2003 | Iijima et al. |
| 6,671,947 | B2 | 1/2004 | Bohr |
| 6,782,610 | B1 | 8/2004 | Iijima et al. |
| 6,814,584 | B2 | 11/2004 | Zaderej |
| 6,828,221 | B2 * | 12/2004 | Iijima et al. .................. 438/616 |
| 6,854,985 | B1 | 2/2005 | Weiss |
| 6,884,709 | B2 | 4/2005 | Iijima et al. |
| 6,908,792 | B2 | 6/2005 | Bruce et al. |
| 6,977,441 | B2 | 12/2005 | Hashimoto |
| 7,034,401 | B2 | 4/2006 | Savastiouk et al. |
| 7,097,462 | B2 | 8/2006 | Ichikawa |
| 7,268,419 | B2 | 9/2007 | Cornelius |
| 7,358,444 | B2 | 4/2008 | Nickerson et al. |
| 7,413,995 | B2 | 8/2008 | Sterrett et al. |
| 7,495,330 | B2 | 2/2009 | Ichikawa |
| 2003/0207492 | A1 | 11/2003 | Maeda et al. |
| 2008/0148559 | A1 | 6/2008 | Nickerson et al. |

OTHER PUBLICATIONS

Dataweek, "Stacked-CSP Delivers Flexibility, Reliability and Space-Saving Capabilities", [online], Aug. 27, 2004, [Retrieved on Jul. 14, 2004], retrieved from the Internet at <URL: http://dataweek.co.za/news.asp?pkINewsID=11744&pkIIssueID=348 &pkICategoryID=36>.

IMEC, "Advanced Packaging Technologies to Bridge the Interconnect Technology Gap", downloaded prior to Aug. 23, 2004, pp. 1-8.

Intel Corporation, "Silicon, Packaging Solutions for a Mobile Marketplace", [online], 2004, [Retrieved on Jul. 14, 2004], retrieved from the Internet at <http://www.intel.com/research/silicon/mobilepackaging.htm>.

Intel Corporation, "The Chip Scale Package (CSP)", 2000 Packaging Databook, 2000, Ch. 15, pp. 15-1 through 15-16.

IVF—The Swedish Institute of Production Engineering Research, "Chapter B: Flip-Chip Technology", [online], [retrieved on Apr. 22, 2004], retrieved from the Internet at <URL: http://extra.ivf.se/ngI/B-Flip-Chip/ChapterB1.htm>.

Mahajan, R., K. Brown, and V. Atluri, "The Evolution of Microprocessor Packaging", Intel Technology Journal, Q3, 2000, 16 pp.

Mahajan, R., R. Nair, V. Wakharkar, J. Swan, J. Tang, and G. Vandentop, "Emerging Directions for Packaging Technologies", Intel Technology Journal, vol. 6, Issue 2, May 2002, pp. 62-75.

Mallik, D., K. Radhakrishnan, J. He, C. Chiu, T. Kamgaing, D. Searls, & J.D. Jackson, "Advanced Package Technologies for High-Performance Systems," Intel Technology Journal, vol. 9, Issue 4, Nov. 9, 2005, 16 pp.

McCormick, A., "Pins & Vias: New Processes, Materials Extend Flexible Circuit Use", [online], May 2003, [Retrieved on Jul. 14, 2004], retrieved from the Internet at <http://neasia.nikkeibp.com/nea/200305/manu_244639.html>.

North Corporation, "Neo-Manhattan Technology: A Novel HDI Manufacturing Process", from IPC Flex & Chips Symposium, Feb. 2003, 32 pp.

* cited by examiner

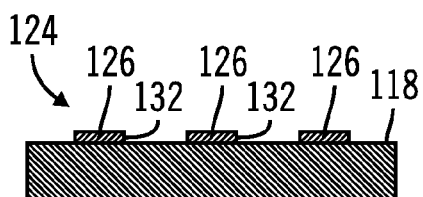
FIG. 5A
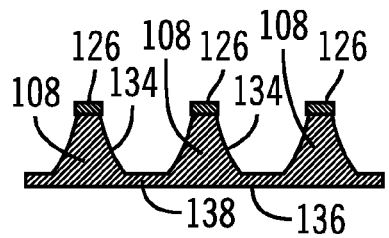
FIG. 5B
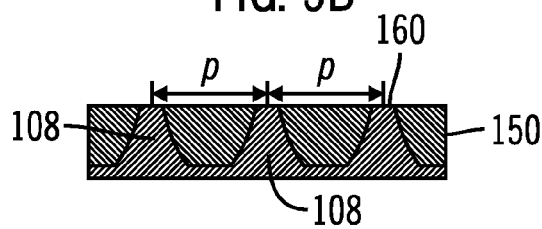
FIG. 5C
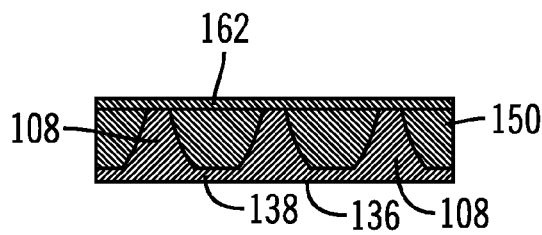
FIG. 5D
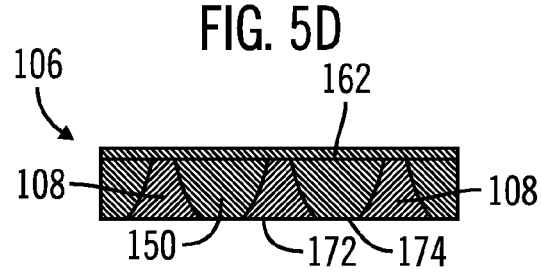
FIG. 5E
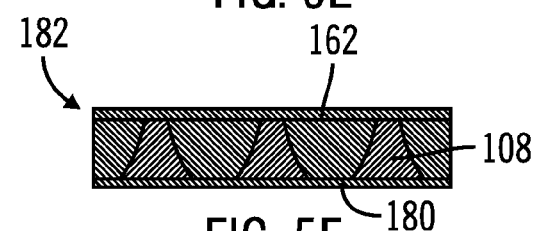
FIG. 5F
FIG. 4

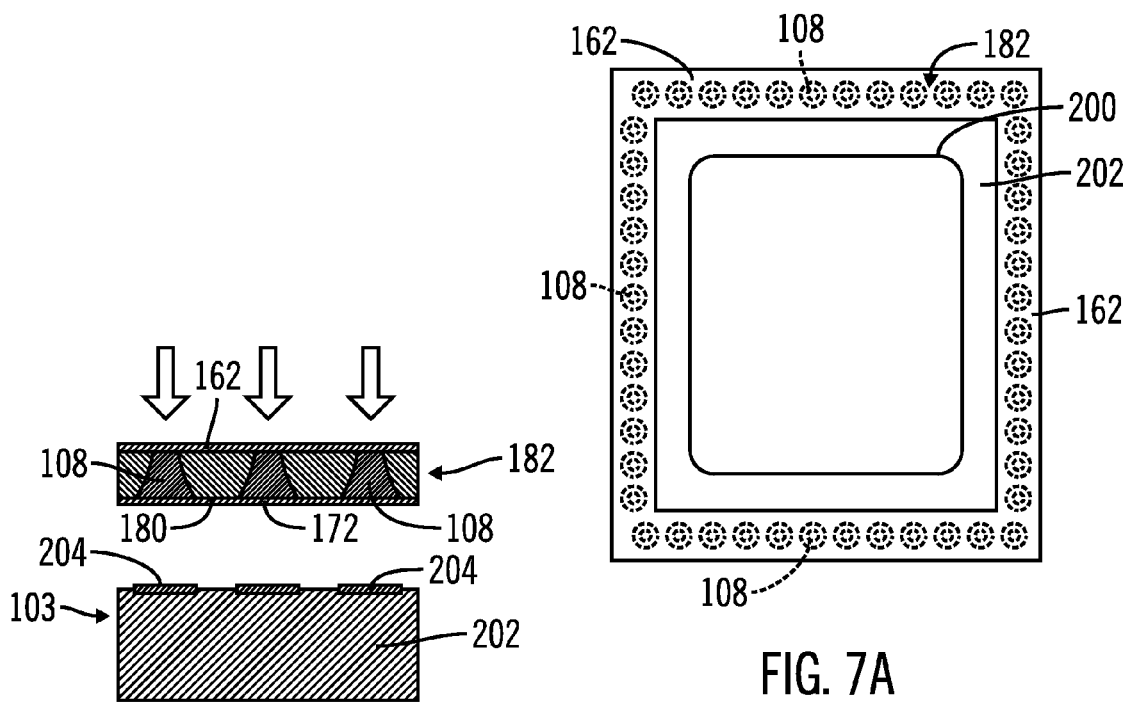
FIG. 6A
FIG. 7A
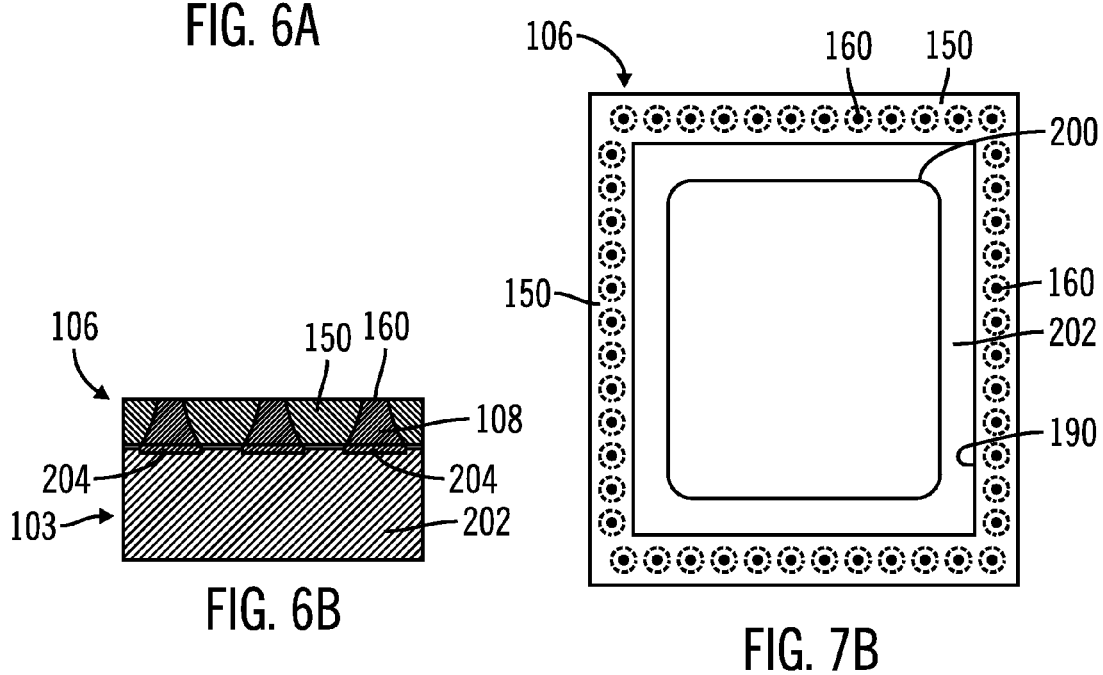
FIG. 6B
FIG. 7B

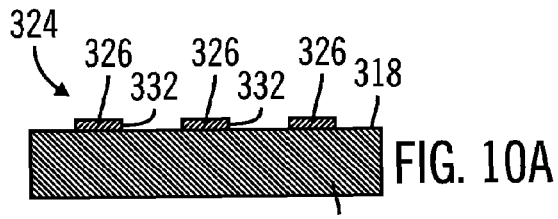
FIG. 10A

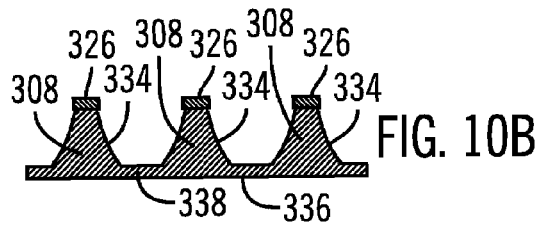
FIG. 10B

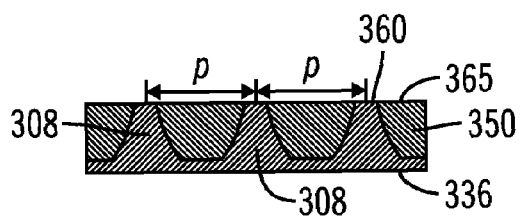
FIG. 10C

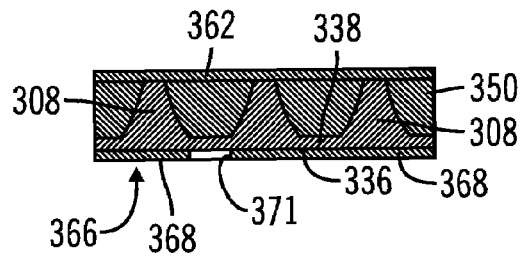
FIG. 10D

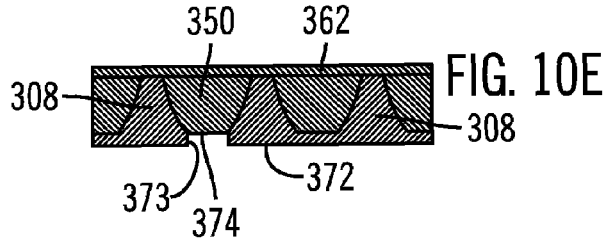
FIG. 10E

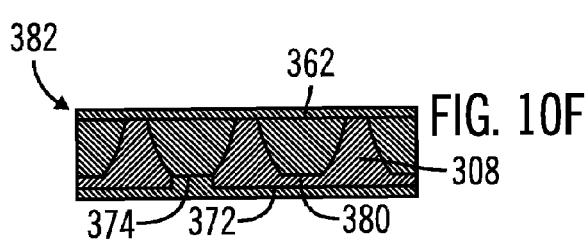
FIG. 10F

Mask a conductive member with an etchant resist to define a plurality of openings. — 322

Apply an etchant through the openings to form a plurality of electrically conductive columnar interconnects defined by etched interstices between columnar interconnects. — 330

Dispense a polymer into interstices between columnar interconnects and cure dispensed polymer. — 352

Attach a carrier to ends of the columnar interconnects and mask other side of conductive member with an etchant resist to define a plurality of openings. — 364

Etch other side of the conductive member to form distal end of each columnar interconnect defined by etched interstices between said second ends of said columnar interconnects. — 370

Apply an adhesive to the distal ends of each columnar interconnect. — 381

ETCHED INTERPOSER FOR INTEGRATED CIRCUIT DEVICES

RELATED APPLICATIONS

This application is a divisional application of application Ser. No. 10/924,396, filed Aug. 23, 2004 now U.S. Pat. No. 7,413,995, assigned to the assignee of the present application, and incorporated by reference in its entirety.

BACKGROUND

Description of Related Art

Integrated circuits typically include various active and passive circuit elements which have been integrated into a piece of semiconductor material, often referred to as a die. The die may, in turn, be encapsulated into a package, which often includes a ceramic or plastic substrate although other materials may be used. These packages are usually attached to a printed circuit board, often by connecting pins arranged along the periphery of the package. In this manner, an electronic system can be assembled by connecting various integrated circuit packages to a printed circuit board.

In addition to mechanically connecting the integrated circuit package to the printed circuit board, the connecting pins also typically provide separate electrical connection terminals between the printed circuit board and the various inputs and outputs of the integrated circuit within the package. To increase the number of connection terminals, other package designs have been utilized. For example, in the pin grid array (PGA) and ball grid array (BGA) packages, a large number of input/output (I/O) connection terminals are disposed in a two dimensional array over a substantial portion of a major surface of the package.

To increase space utilization, two or more integrated circuit dies may be attached to a printed circuit board in a stacked arrangement. The dies may be interconnected in a die-to-die stacked arrangement. Alternatively, each die may be placed in a package and the two packages may be stacked in a package-to-package arrangement. FIG. 1a shows an exploded view of one such known package-to-package stack indicated generally at 10. The stack 10 includes a first integrated circuit package 12, and a second integrated circuit package 14 which are physically and electrically connected together as shown in FIG. 1b using an interposer 16.

The integrated circuit package 12 includes a package substrate 20 on which an integrated circuit die 22 is mechanically and electrically connected by a plurality of solder bumps 24. Similarly, the integrated circuit package 14 includes a package substrate 26 to which an integrated circuit die 28 is mechanically and electrically connected by a plurality of solder bumps 30. Other electrical connectors including wires may be used in place of or in addition to the solder bumps 24, 30. The package substrates 20, 26 may have both internal and exterior conductors which are electrically connected to the solder bumps 24, 30 or to contact pads on the dies 22, 28.

The dies 22, 28 may be encapsulated in a polymer such as an epoxy layer 32 depicted for the die 28. The inputs and outputs of the stack 10 may be electrically connected to a printed circuit board using connection pins, solder bumps or other connection terminals.

As best seen in FIG. 1c, the interposer 16 includes a generally rectangular ring-shaped frame 34 which may be constructed of a dielectric material such as plastic or ceramic, for example. The frame 34 has a plurality of apertures distributed about its periphery into which plugs 36 may be punched into the frame apertures and secured therein in an interference fit. The plugs 36 are typically formed of an electrically conductive material such as copper and may each be bonded to aligned contact pads 40 and 42 of the package substrates 20 and 26, respectively, as shown in FIG. 1b. The copper plugs 36 may be bonded to the contact pads 40, 42 of the package substrates 20, 26 using stencil printed solder or other materials including electroplated solder, ink jet solder or adhesives or using other bonding techniques including thermocompression and thermosonic joining.

Each plug 36 can provide a separate electrical interconnection between the packages 12 and 14. The center to center spacing or "pitch" between adjacent force fit plugs 36 may be as low as 300 microns, in some applications. Interposers may be used to provide die-to-die or die-to-package substrate interconnections.

Notwithstanding, there is a continued need in the art to improve the capabilities of interposers for integrated circuit applications.

BRIEF DESCRIPTION OF THE DRAWINGS

Referring now to the drawings in which like reference numbers represent corresponding parts throughout:

FIG. 4 illustrates one example of operations to form an interposer in accordance with one embodiment of the present description;

FIGS. 5a-5f are schematic cross-sectional views of operations to form an interposer in accordance with one embodiment of the present description;

FIGS. 6a and 6b are schematic cross-sectional views of operations to connect an interposer to an integrated circuit package in accordance with one embodiment of the present description;

FIGS. 7a and 7b are schematic top views of the operations of FIGS. 6a and 6b, respectively;

FIG. 9 illustrates one example of operations to form an interposer in accordance with another embodiment of the present description;

FIGS. 10a-10f are schematic cross-sectional views of operations to form an interposer in accordance with another embodiment of the present description;

DETAILED DESCRIPTION OF THE ILLUSTRATED EMBODIMENTS

In the following description, reference is made to the accompanying drawings which form a part hereof and which illustrate several embodiments of the present disclosure. It is understood that other embodiments may be utilized and structural and operational changes may be made without departing from the scope of the present description.

Figure 1A:
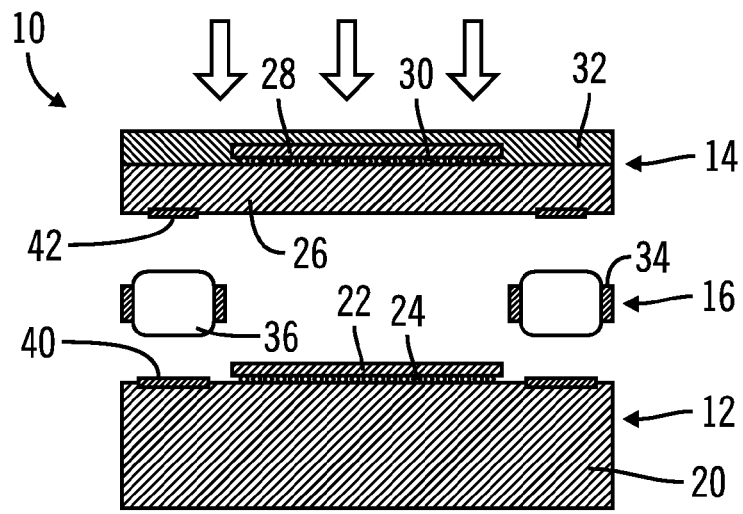
FIGS. 1a and 1b schematically illustrate a prior art interposer connecting integrated circuit packages in a package-to-package stack.
Figure 1B:
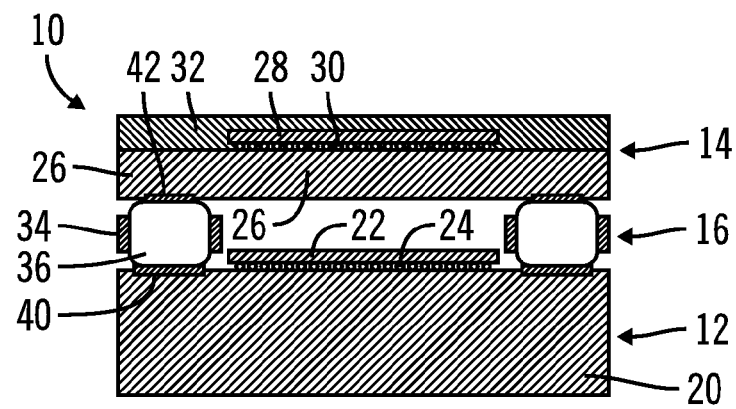
Figure 1C:
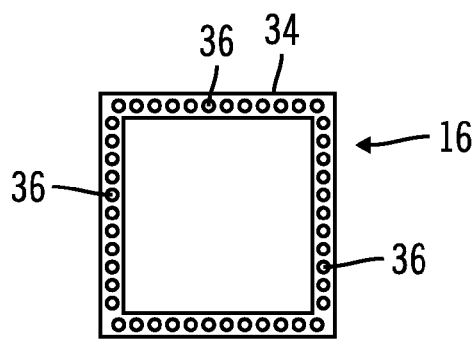
FIG. 1c is a top schematic view of the prior art interposer of FIGS. 1a and 1b.
Figure 2:
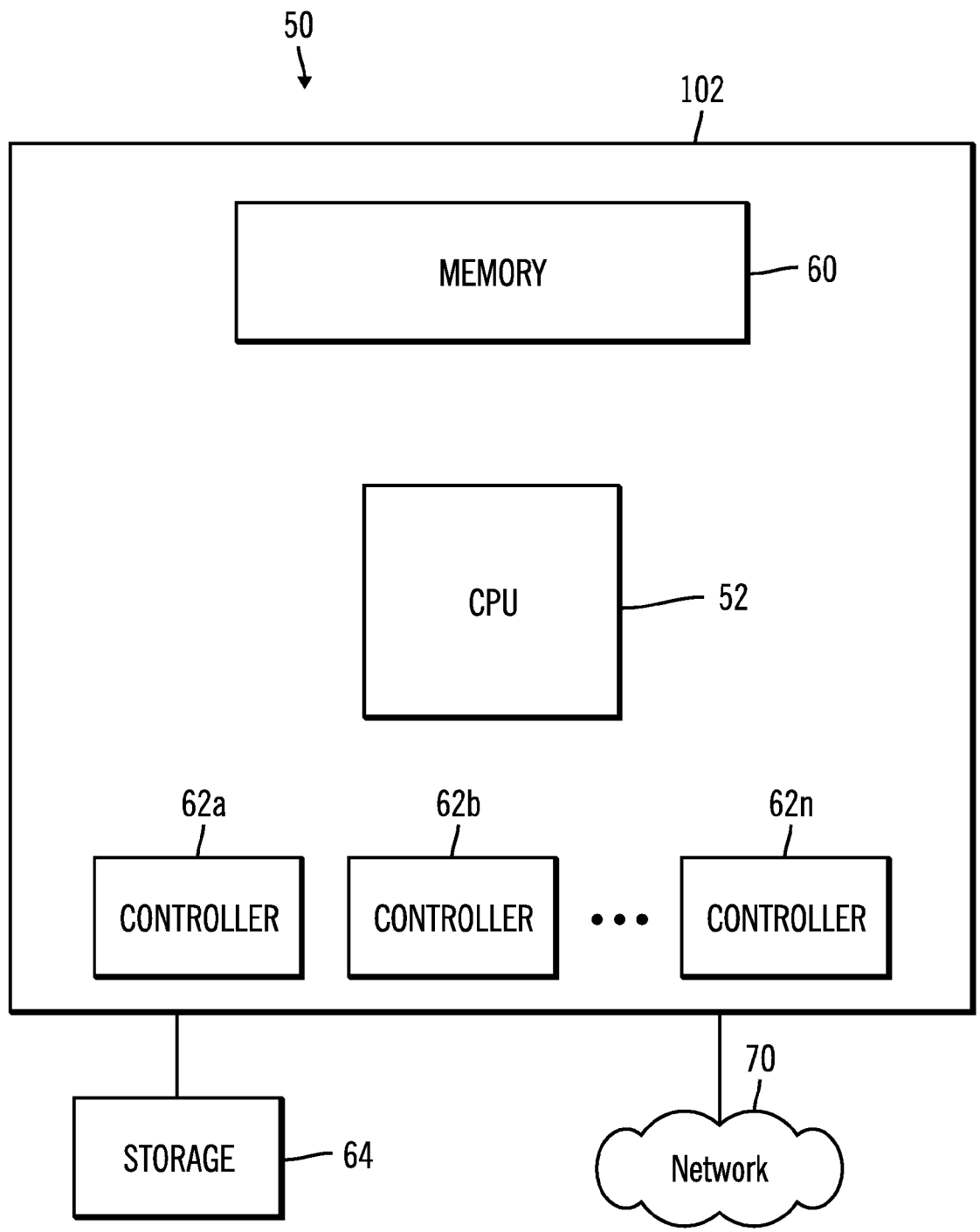
FIG. 2 illustrates one embodiment of a computing environment in which aspects of the description provided herein are embodied.

FIG. 2 illustrates a computing environment in which aspects of described embodiments may be embodied. A computer 50 includes one or more central processing units (CPU) 52 (only one is shown), a memory 60 and a plurality of controllers 62a, 62b . . . 62n. Each of the CPU 52, and controllers 62a, 62b . . . 62n include one or more electronic devices. Once such electronic device is represented by an electronic device 100 (FIG. 3) which is electrically and mechanically coupled to a printed circuit board 102. The device 100 of this embodiment includes a package-to-package stack comprising a first integrated circuit package 103, and a second integrated circuit package 104 which are mechanically and electrically connected using an interposer 106. As explained in greater detail below, the interposer 106 includes columnar interconnects 108 which may be fabricated by etching a conductive member such as copper foil, for example. In one application, the pitch or center to center spacing of the columnar interconnects 108 may be defined by masking techniques to provide an interconnect pitch suitable for a particular application. In yet another aspect, etching rates may be controlled to provide height to width aspect ratios of the columnar interconnects 108 which are suitable for various applications.

The printed circuit board 102 may be a single layer or multi-layered motherboard which has a plurality of conductive lines that provide communication between the circuits in the device 100 and other components mounted to the board 102. Alternatively, one or more of the CPU 52, memory 60 and controllers 62a, 62b . . . 62n may be disposed on other cards such as daughter cards or expansion cards.

An operating system and various applications execute on the CPU 52 and reside in the memory 60. The content residing in memory 60 may be cached in accordance with known caching techniques. Programs and data in memory 60 may be swapped into storage 64 as part of memory management operations. The computer 50 may comprise any computing device known in the art, such as a mainframe, server, personal computer, workstation, laptop, handheld computer, telephony device, network appliance, virtualization device, storage controller, network controller, etc. Any CPU 52 and operating system known in the art may be used.

The controllers 62a, 62b . . . 62n may include a system controller, peripheral controller, memory controller, hub controller, I/O bus controller, video controller, network controller, storage controller, etc. For example, a storage controller can control the reading of data from and the writing of data to the storage 64 in accordance with a storage protocol layer. The storage protocol of the layer may be any of a number of known storage protocols. Data being written to or read from the storage 62 may be cached in accordance with known caching techniques.

A network controller can include one or more protocol layers to send and receive network packets to and from remote devices over a network 70. The network 70 may comprise a Local Area Network (LAN), the Internet, a Wide Area Network (WAN), Storage Area Network (SAN), etc. Embodiments may be configured to transmit data over a wireless network or connection. In certain embodiments, the network controller and various protocol layers may employ the Ethernet protocol over unshielded twisted pair cable, token ring protocol, Fibre Channel protocol, etc., or any other network communication protocol known in the art.

FIGS. 4 and 5a-5f show an example of operations for fabricating an interposer 106 utilizing etching techniques. A face 118 of a conductive member 120 (FIG. 5a) is masked (block 122) with an etchant resist pattern 124 which includes a plurality of etchant resist pattern elements as represented by pattern elements 126. In the illustrated embodiment, the conductive member 120 is conductive metal foil such as a copper foil, for example. It is appreciated that other types of conductive materials such as aluminum or gold may be used. It is also appreciated that other member shapes such as bars, plates and irregular shapes may be used as well. In some applications, a nonmetal conductive member may be utilized. The degree of conductivity, the degree of etch susceptibility and other properties may vary, depending upon the particular application.

An etchant is applied (block 130) through openings 132 between the mask pattern elements 126 to at least partially form a plurality of conductive columnar interconnects 108 (FIG. 5b) defined by etched interstices 134 between the interconnects 108. In this embodiment, the etching process may be halted before the etching process proceeds completely through the opposite face 136 of the conductive member 120. As a consequence, a certain amount of bridging material 138 of the conductive member 120 may be retained between the columnar interconnects 108 to at least temporarily hold the interconnects 108 together.

The shapes of the columnar interconnects 108 and interstices 134 between the interconnections 108 are characteristic of the etching processes. Factors which affect the etching process include the particular conductive material selected for the member 120, the crystalline orientation if any of the conductive member 120, the particular etchant selected and the temperature at which the etching process occurs. Controlling these and other factors is within the capability of those skilled in the art of etching to achieve the columnar interconnect shapes appropriate for the particular applications.

The size and spacing of the interconnects 108 as well as the distribution of the interconnects 108 may be controlled by the design of the masking pattern 124 on the face 118 of the conductive member 120. In one embodiment, the interconnects may be spaced at a minimum pitch p (FIG. 5c) of less than 100 microns or less than 75 microns, for example. A minimum pitch of greater or lesser size may be selected, depending upon the particular application. In one embodiment, the spacing between adjacent interconnects 108 is substantially uniform. It is appreciated that in other applications, the spacing between adjacent interconnects 108 may vary, depending upon a variety of factors. A masking pattern to achieve a selected size, spacing and distribution of the interconnects 108 may be achieved by those skilled in the etching art.

To form a body 150 around the interconnects 108, a material such as a polymer in liquid form may be dispensed (block 152) into the interstices 134 between the columnar interconnects 108 and cured to harden the body 150. In addition, the mask pattern elements 126 of the mask pattern 124 may be stripped or otherwise removed from the free ends 160 of the columnar interconnects. In this embodiment, the body 150 is formed in a manner which leaves the free ends 160 of the columnar interconnects 108 exposed after the pattern elements 126 are removed. It is believed that any of a number of materials, as well as dispensing and curing techniques are suitable to form a body 150, depending upon the particular application. Factors affecting the selection include the degree of rigidity, the electrical insulative properties, and the heat conductivity suitable for a particular application. A body 150 having the appropriate characteristics may be achieved by those skilled in the electronic device packaging art. In the illustrated embodiment, the body 150 can function as a carrier as discussed below.

A temporary carrier such as a carrier tape 162 (FIG. 5d) may be attached (block 164) to the free ends 160 of the columnar interconnects 108. Secured by the carrier tape 162 and the body 150, the other face 136 of the conductive member 120 may be etched (block 170) as shown in FIG. 5e. In this second etching operation, some or all of the bridging material 138 between the columnar interconnects 108 may be removed thereby effectively separating and electrically isolating some or all of the columnar interconnects 108 from each other. In this manner, the distal ends 172 of the columnar interconnects 108 are formed. In addition, a face 174 of the body 150 adjacent the interconnect distal ends 172 may be exposed. In the illustrated embodiment, the electrically separated columnar interconnects 108 are mechanically secured together by the body 150. An appropriate selection and shaping of the disconnected distal ends 172 may be achieved by those skilled in the etching art. It is appreciated that other techniques may be used to remove bridging material 138 including grinding and polishing. Etching rates may be controlled to provide height to width aspect ratios of the columnar interconnects 108 which are suitable for various applications. For example, each columnar interconnect may have a height to width aspect ratio in the range of 0.5 to 2.5.

To prepare the columnar interconnects 108 to be attached to the first integrated circuit package 103 (FIG. 3), an adhesive layer 180 may be applied (block 171) to the distal ends 172 of the interconnects 108 and to the face 174 of the body 150 to complete an embodiment of an interposer assembly 182 as shown in FIG. 5f. A variety of adhesives are suitable. In the illustrated embodiment, the adhesive layer 180 is formed of a B-stage epoxy, for example. An adhesive layer 180 having the appropriate characteristics may be achieved by those skilled in the electronic device packaging art.

FIGS. 6a, 6b and 7a, 7b illustrate an example of an interposer assembly 182 being joined to an integrated circuit package 103 which includes an integrated circuit die 200 (FIG. 7a) supported by an integrated circuit package substrate 202. Disposed on the periphery of the substrate 202 and around the die 200 is a plurality of electrically conductive contact pads 204, each of which is aligned with and facing the distal end 172 of a corresponding columnar interconnect 108 of the interposer assembly 182. The conductive contact pads 204 may be electrically connected with other conductors using "via" technology, that is, plated through holes, or other techniques which provide a conductive surface.

Secured by the carrier tape 162, the interposer assembly 182 may be joined with the integrated circuit package 103 with the distal end 172 of each interconnect 108 bonding to an associated contact pad 204 of the package substrate 202 as shown in FIGS. 6b and 7b. In the illustrated embodiment, for example, the interposer assembly 182 and the package 103 are compressed together with a suitable compressive force and application of heat. The columnar interconnects 108 are diffusion bonded, metal to metal, with the associated contact pads 204 of the package substrate 202. It is appreciated that the interposer assembly 182 may be joined and bonded to the package 103 using a variety of techniques. An appropriate joining and bonding may be achieved by those skilled in the electronic device packaging art.

After the interposer assembly 182 is joined to the integrated circuit package 103, the carrier strip 162 (FIGS. 6a, 7a) may be removed as shown in FIGS. 6b, 7b, exposing the first ends 160 of the columnar interconnects 108 of the interposer 106. It is appreciated that other carriers 162 may be selected depending upon the particular application. Factors affecting the selection of the carrier 162 include the tackiness of the carrier 162 to facilitate holding the interposer 106 while the distal ends 172 are being etched and to facilitate removing the carrier 162 once the interposer 106 is bonded to an integrated circuit package element.

In the illustrated embodiment, interposer 106 is depicted as being generally rectangular in shape (FIG. 7a) and having a generally rectangular interior window 190. It is appreciated that the interposer may have a variety of different shapes, depending upon the particular application.

Figure 8:
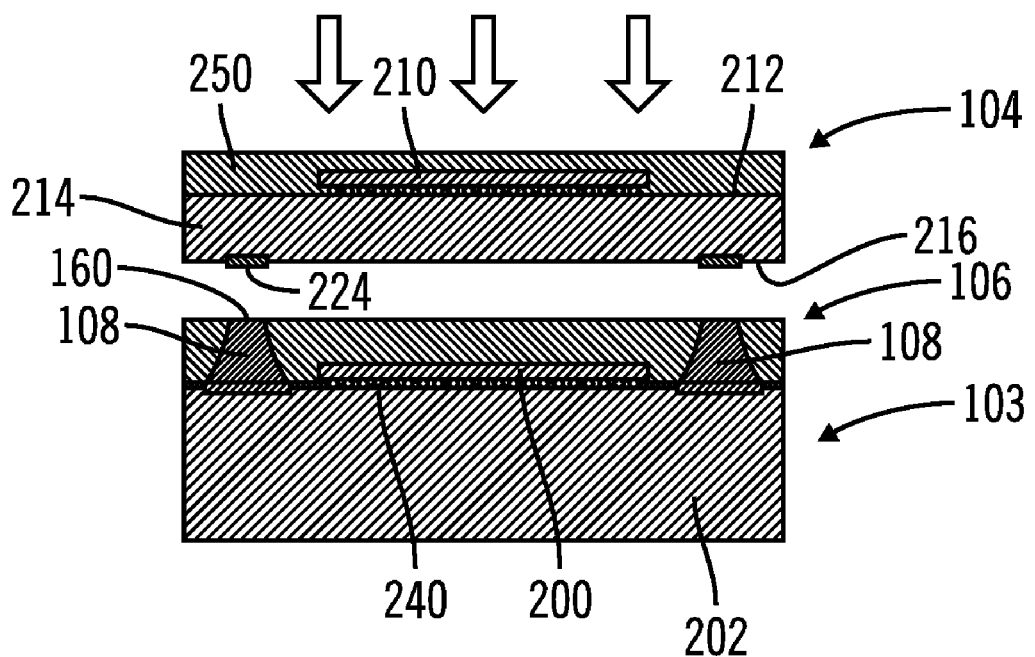
FIG. 8 is an exploded schematic cross-sectional view of an interposer connecting integrated circuit packages in a package-to-package stack utilizing an interposer in accordance with one embodiment of the present description.
Figure 3:
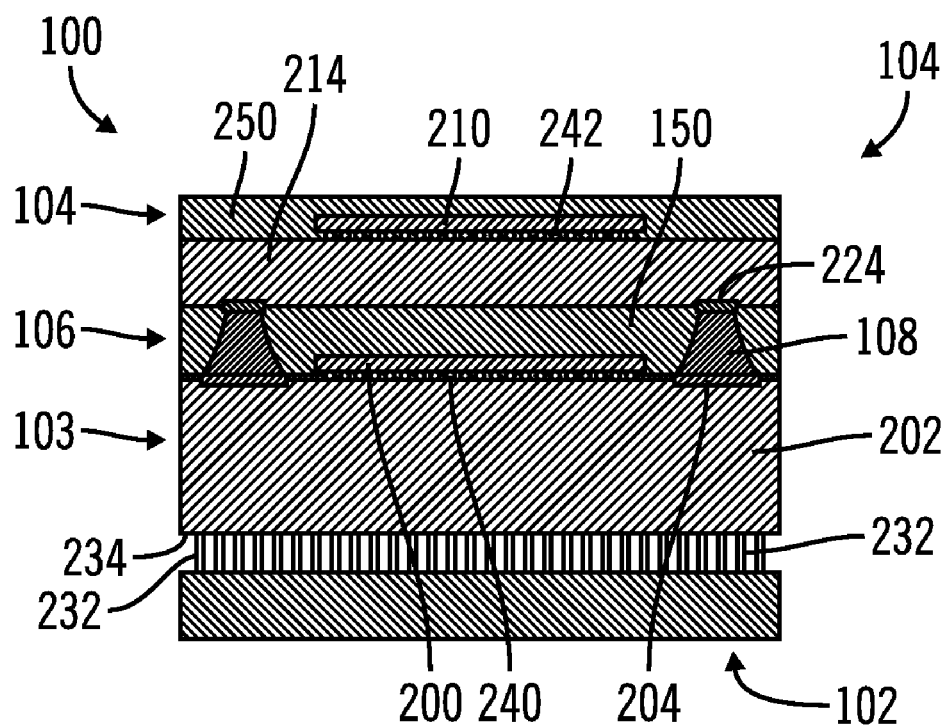
FIG. 3 schematically illustrates a package-to-package stack utilizing an interposer in accordance with one embodiment of the present description.

FIGS. 8 and 3 illustrate an example of the interposer 106 joined to the integrated circuit package 103 on one side of the interposer 106, and being joined on its other side to the second integrated circuit package 104 to form the package-to-package stack of the electronic device 100 (FIG. 3). Like the package 103, the integrated circuit package 104 includes an integrated circuit die 210 supported on one face 212 of an integrated circuit package substrate 214. Disposed on the periphery of the substrate 202 but on a face 216 opposite the face 212 supporting the die 210, is a plurality of electrical contact pads 224, each of which is aligned with and facing an end 160 of a corresponding columnar interconnect 108 of the interposer 106.

The interposer 106 may be joined with the integrated circuit package 104 with the end 160 of each interconnect 108 bonding to an associated contact pad 224 of the package substrate 214 as shown in FIG. 3. In the illustrated embodiment, for example, the package 103, interposer 106 and the package 104 are compressed together with a suitable compressive force and application of heat. The columnar interconnects 108 are diffusion bonded, metal to metal, with the associated contact pads 224 of the package substrate 214. It is appreciated that the interposer 106 may be joined and bonded to the package 104 using a variety of techniques. An appropriate joining and bonding may be achieved by those skilled in the electronic device packaging art.

The inputs and outputs of the electronic device 100 may be electrically connected to a printed circuit board 102 using connection terminals 232 which may include connection pins, solder bumps or other connection devices. In the illustrated embodiment, the connection terminals 232 depend from a bottom face 234 of the device 100. It is appreciated that the connection terminals 232 may extend from other faces of the device 100 as well.

In the illustrated embodiment, the integrated circuit die 200 is mechanically and electrically connected by a plurality of solder bumps 240 to electrical conductors of the package substrate 202. Similarly, the integrated circuit die 210 is mechanically and electrically connected by a plurality of solder bumps 242 to electrical conductors of the package substrate 214. Other electrical connectors including wires may be used in place of or in addition to the solder bumps 240, 242. The package substrates 202, 214 may have both internal and exterior conductors which are electrically connected to the solder bumps 240, 242, contact pads 204, 224 and connection terminals 232.

The inputs and outputs of the device 100 may be electrically connected to the printed circuit board 230 via the connection terminals 232, substrate conductors, substrate contact pads 204, 224, solder bumps 240, 243 and interposer columnar interconnects 108.

The printed circuit board 102 may be a single layer or multi-layered board which has a plurality of conductive lines that provide communication between the circuits in the device 100 and other components mounted to the board 230.

The integrated circuit dies 200, 210 may be encapsulated in a polymer such as an epoxy layer 250 depicted for the die 210 The integrated circuits of the dies 200, 210 may contain memory, logic or other elements as is known in the art.

FIGS. 9 and 10a-10f show another example of operations for fabricating an interposer utilizing etching techniques. The initial operations of this example are similar to the initial operations of the example of FIGS. 4 and 5a-5f. Accordingly, a face 318 of a conductive member 320 (FIG. 10a) is masked (block 322) with an etchant resist pattern 324 which includes a plurality of etchant resist pattern elements as represented by pattern elements 326.

An etchant is applied (block 330) through openings 332 between the mask pattern elements 326 to at least partially form a plurality of conductive columnar interconnects 308 (FIG. 10b) defined by etched interstices 334 between the interconnects 308. Again, in this embodiment, the etching process may be halted before the etching process proceeds completely through to the opposite face 336 of the conductive member 320. As a consequence, some bridging material 338 of the conductive member 320 may be retained between the columnar interconnects 308 to at least temporarily hold the interconnects 308 together.

To form a body 350 (FIG. 10c) around the interconnects 308, a material such as a polymer in liquid form may be dispensed (block 352) into the interstices 334 between the columnar interconnects 308 and cured to harden the body 350. In addition, the mask pattern elements 326 of the mask pattern 324 may be stripped or otherwise removed from the free ends 360 of the columnar interconnects. In this embodiment, the body 350 is formed in a manner which leaves the free ends 360 of the columnar interconnects 308 exposed after the pattern elements 326 are removed.

A temporary carrier such as a carrier tape 362 (FIG. 10d) may be attached (block 364) to the free ends 360 of the columnar interconnects 308 and the face 365 of the body 350. Secured by the carrier tape 362 and the body 350, the other face 336 of the conductive member 320 may be masked (block 364) with an etchant resist pattern 366 which includes a plurality of etchant resist pattern elements as represented by pattern elements 368.

An etchant is applied (block 370) through openings 371 between the mask pattern elements 368 to remove selected bridging material 338 between the columnar interconnects 308 to define one or more apertures 373, thereby effectively separating and electrically isolating selected columnar interconnects 308 from each other. However, selected bridging material 338 between the columnar interconnects 308 may also be retained thereby effectively electrically interconnecting selected columnar interconnects 308 to each other. Thus, the bridging material 338 of the conductive member 320 may be etched to form transverse interconnects 338 between selected columnar interconnects 308 such that the interposer can function as a redistribution layer. It is appreciated that other techniques may be used to remove and shape bridging material 338 including grinding and polishing.

The pattern elements 368 may be stripped exposing the distal ends 372 of the columnar interconnects 308. In addition, a face 374 of the body 350 adjacent the interconnect distal ends 372 may be exposed. In the illustrated embodiment, the electrically separated columnar interconnects 308 are mechanically secured together by the body 350.

To prepare the columnar interconnects 308 to be attached to an element such as a first integrated circuit die, an adhesive layer 380 may be applied (block 381) to the distal ends 372 of the interconnects 308 and to the face 374 of the body 350 to complete an embodiment of an interposer assembly 382 as shown in FIG. 10f.

Figure 11A:
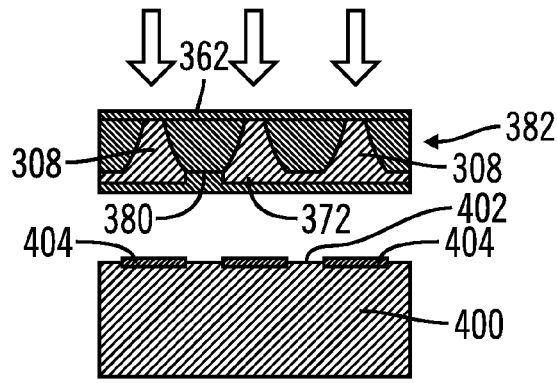
FIGS. 11a-11c are schematic cross-sectional views of operations to connect an interposer to an integrated circuit die accordance with another embodiment of the present description.
Figure 11B:
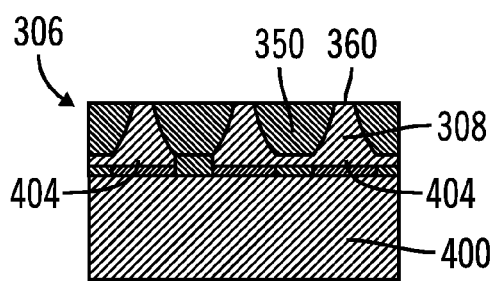
Figure 11C:
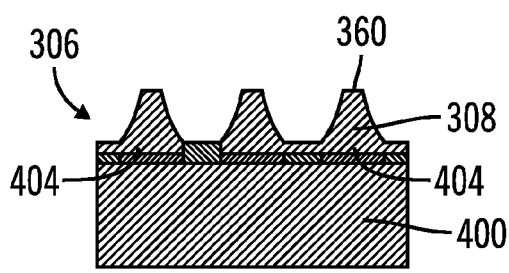

FIGS. 11a-11c illustrate an example of an interposer assembly 382 being joined to an integrated circuit die 400. Distributed on a top surface 402 of the die 400 is an array of electrically conductive contact pads 404, each of which is aligned with and facing the distal end 372 of a corresponding columnar interconnect 308 of the interposer assembly 382. The conductive contact pads 404 may be electrically connected with other conductors using "via" technology, that is, plated through holes, or other techniques which provide a conductive surface.

Secured by the carrier tape 362, the interposer assembly 382 may be joined with the die 400 with the distal end 372 of each interconnect 308 bonding to an associated contact pad 404 of the integrated circuit die 400 as shown in FIG. 11b. After the interposer assembly 382 is joined to the integrated circuit die 400, the carrier strip 362 (FIG. 11a) may be removed as shown in FIG. 11b, exposing the first ends 360 of the columnar interconnects 308 of the interposer 306. In addition, the body 350 of polymer may be stripped as well as shown in FIGS. 11c and 12.

Figure 12:
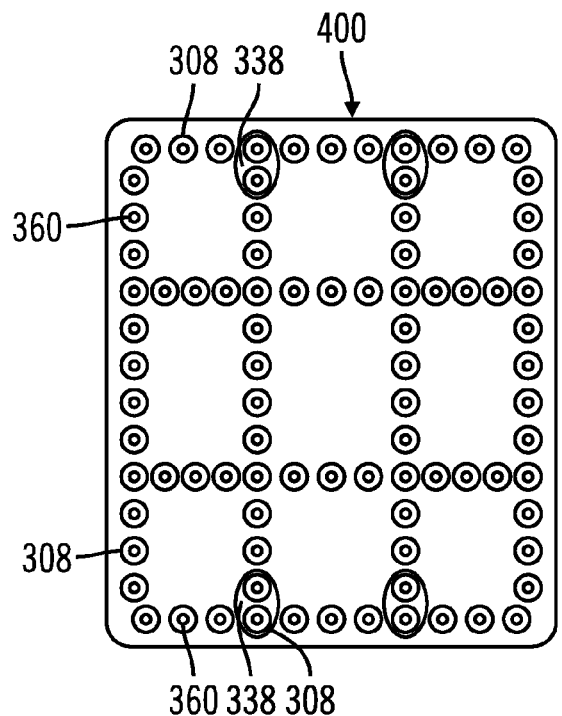
FIG. 12 is a schematic top view of the interposer and integrated circuit die of FIG. 11c.

As best seen in the top view of FIG. 12, the columnar interconnects 308 may be distributed in an array positioned over the die 400. It is appreciated that the columnar interconnects may be distributed in other patterns, depending upon the particular application. Moreover, the columnar interconnects 308 bonded to underlying die contact pads 404 may be selectively interconnected to other columnar interconnects 308 by conductive transverse interconnects 338 formed of bridging material 338 to provide a redistribution layer.

Figure 13A:
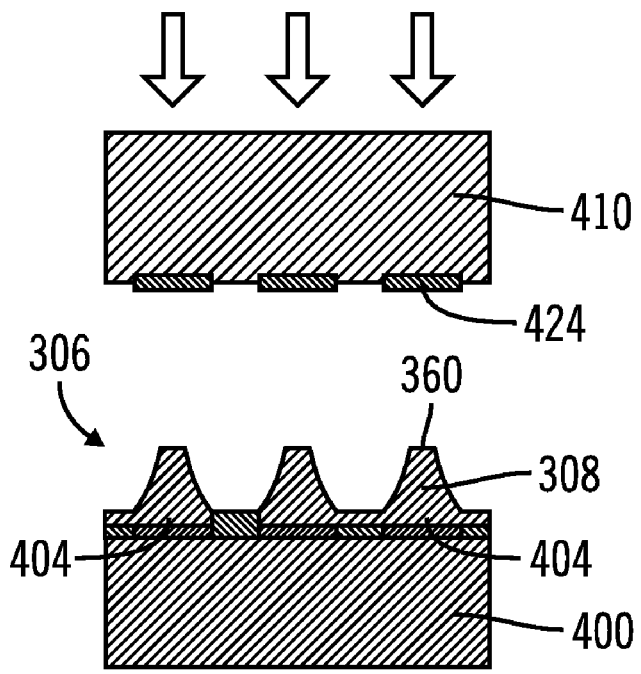
FIGS. 13a and 13b are exploded schematic cross-sectional views of operations of connecting integrated circuit dies in a die-to-die stack utilizing an interposer in accordance with another embodiment of the present description.
Figure 13B:
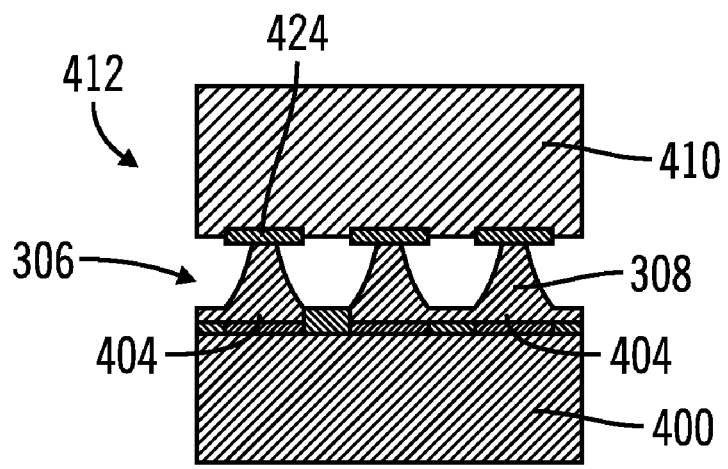

FIGS. 13a and 13b illustrate an example of the interposer 306 joined to the integrated circuit die 400 on one side of the interposer 306, and being joined on its other side to a second integrated circuit die 410 to form a die-to-die stack of an electronic device 412. Like the die 400, the integrated circuit die 410 includes an array of electrical contact pads 424, each of which is aligned with and facing an end 360 of a corresponding columnar interconnect 308 of the interposer 306.

The interposer 306 may be joined with the integrated circuit die 410 with the end 360 of each interconnect 308 bonding to an associated contact pad 424 of the die 410 as shown in FIG. 13b. In the illustrated embodiment, for example, the die 400, interposer 306 and the die 410 are compressed together with a suitable compressive force and application of heat. The columnar interconnects 308 are diffusion bonded, metal to metal, with the associated contact pads 404, 424 of the dies 400, 410. It is appreciated that the interposer 306 may be joined and bonded to the dies 400, 410 using a variety of techniques. The inputs and outputs of the electronic device 412 may be electrically connected to a printed circuit board using connection terminals which may include connection pins, solder bumps or other connection devices.

Additional Embodiment Details

In certain embodiments, the interposer embodiments may be embodied in a computer system including a video controller to render information to display on a monitor coupled to a computer system comprising a desktop, workstation, server, mainframe, laptop, handheld computer, etc. Alternatively, the interposer embodiments may be embodied in a computing device that does not include a video controller, such as a switch, router, etc.

The illustrated operations of FIGS. 4, 5a-5f, 6a-6b, 9, 10a-10f, 11a-11c, and 13a-13b show certain events occurring in a certain order. In alternative embodiments, certain operations may be performed in a different order, modified or removed. Moreover, operations may be added to the above described operations and still conform to the described embodiments. Further, operations described herein may occur sequentially or certain operations may be processed in parallel.

Figure 14:
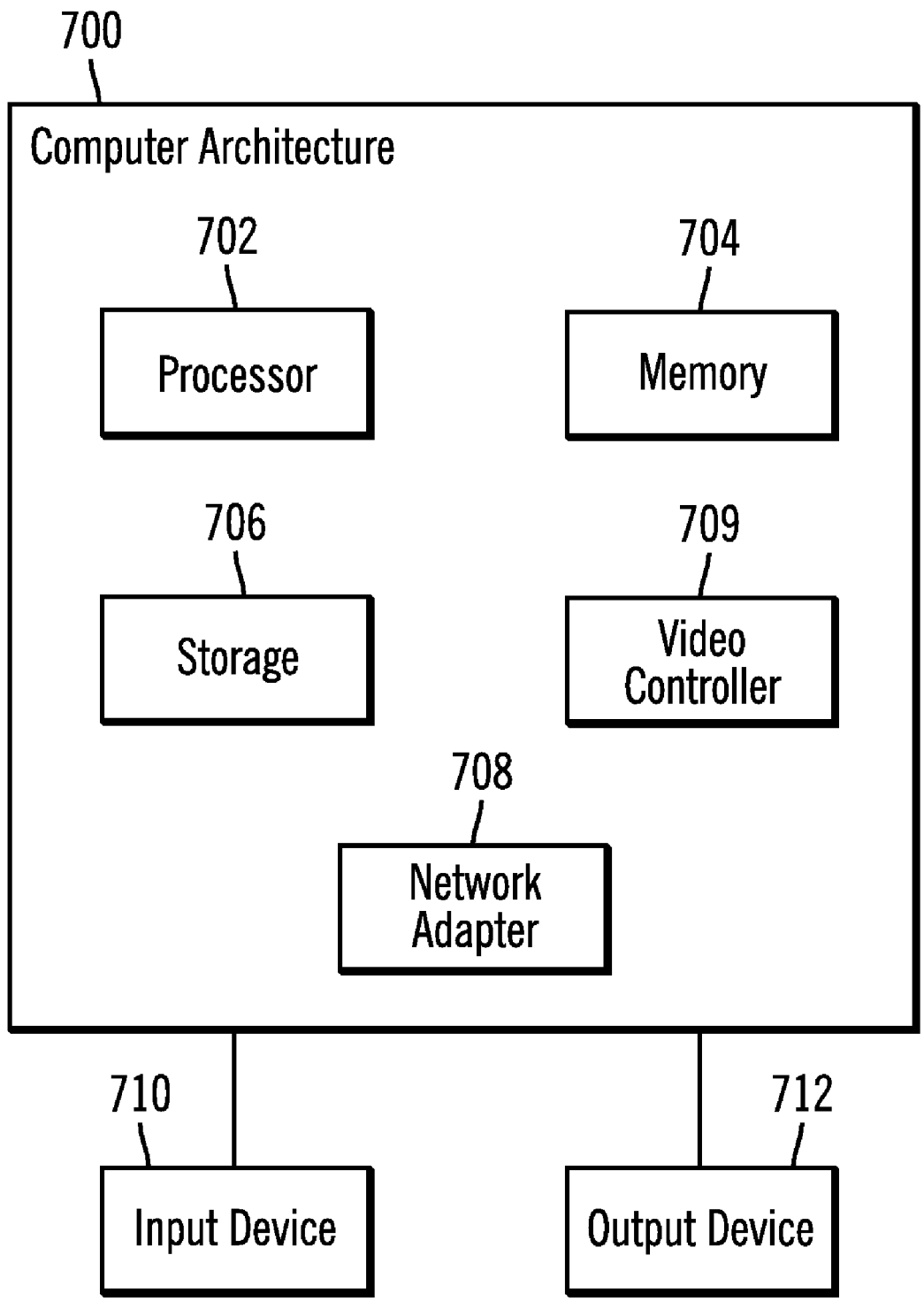
FIG. 14 illustrates an architecture that may be used with the described embodiments.

FIG. 14 illustrates one embodiment of a computer architecture 700 which can utilize components, such the devices shown in FIG. 3. One or more components or devices may utilize a interposer in accordance with the description provided herein.

The architecture 700 may include a processor 702 (e.g., a microprocessor), a memory 704 (e.g., a volatile memory device), and storage 706 (e.g., a non-volatile storage, such as magnetic disk drives, optical disk drives, a tape drive, etc.). The processor 702 may be mounted on a motherboard, for example. The storage 706 may comprise an internal storage device or an attached or network accessible storage. Programs in the storage 706 are loaded into the memory 704 and executed by the processor 702 in a manner known in the art. The architecture further includes a network adapter 708 to enable communication with a network, such as an Ethernet, a Fibre Channel Arbitrated Loop, etc. Further, the architecture may, in certain embodiments, include a video controller 709 to render information on a display monitor, where the video controller 709 may be embodied on a video card or integrated on integrated circuit components mounted on the motherboard. Certain of the devices may have multiple cards or controllers. An input device 710 is used to provide user input to the processor 702, and may include a keyboard, mouse, pen-stylus, microphone, touch sensitive display screen, or any other activation or input mechanism known in the art. An output device 712 is capable of rendering information transmitted from the processor 702, or other component, such as a display monitor, printer, storage, etc.

The network adapter 708 or other devices described herein may be mounted on an expansion card, such as a Peripheral Component Interconnect (PCI) card, PCI-express or some other I/O expansion card coupled to a motherboard, or on integrated circuit components mounted on the motherboard. Devices may be mounted directly to a card or may utilize a interposer in accordance with the description provided herein. Thus, interposer embodiments may be embodied in computer systems or other systems in which a interposer in accordance with the present description is mounted on one or both of a motherboard and an expansion card. Accordingly, in some system embodiments, the system may lack an expansion card, and a interposer in accordance with the present description may be mounted on a motherboard. In another system embodiment, a interposer in accordance with the present description may be mounted on an expansion card but not on a motherboard.

Details on the PCI architecture are described in "PCI Local Bus, Rev. 2.3", published by the PCI-SIG. Details on the Fibre Channel architecture are described in the technology specification "Fibre Channel Framing and Signaling Interface", document no. ISO/IEC AWI 14165-25. Details on the Ethernet protocol are described in publications including "IEEE std. 802.3," published Mar. 8, 2002, and "IEEE std. 802.11," published 1999-2003.

The foregoing description of various embodiments has been presented for the purposes of illustration and explanation. It is not intended to be exhaustive or to limit to the precise form disclosed. Many modifications and variations are possible in light of the above teaching. For example, an interposer in accordance with the present disclosure may be used to connect a die to a substrate.

What is claimed is:

1. A device, comprising:
a first element having a first plurality of electrical contacts wherein said first element is selected from a group consisting of an integrated circuit package, an integrated circuit die, a substrate;
a second element having a second plurality of electrical contacts wherein said second element is selected from a group consisting of an integrated circuit package, an integrated circuit die, a substrate; and
an interposer comprising a plurality of etched, electrically conductive columnar interconnects defined by etched interstices between said interconnects and wherein each columnar interconnect has a first end and a second end, each end having a bonding surface, said interposer further comprising a rigid supporting body formed around said interconnects, said supporting body having a first face defining first apertures exposing said bonding surfaces of said first ends wherein a bonding surface of each first end of said interconnects is bonded and electrically connected to an electrical contact of said first element, and wherein said supporting body has a second face defining second apertures exposing said bonding surfaces of said second ends wherein a bonding surface of each second end of said interconnects is bonded and electrically connected to an electrical contact of said second element, wherein said rigid supporting body comprises a cured polymer filling at least some of said interstices of said interposer between said columnar interconnects.

2. The device of claim 1 wherein said first element is an integrated circuit package and said second element is an integrated circuit package.

3. The device of claim 2 wherein said device is a stacked package.

4. The device of claim 1 wherein said first element is an integrated circuit die and said second element is an integrated circuit die.

5. The device of claim 1 wherein said first element is an integrated circuit die and said second element is a substrate.

6. The device of claim 1 further comprising a cured polymer filling at least some of said interstices of said interposer between said columnar interconnects.

7. The device of claim 1 wherein each columnar interconnect first end is diffusion bonded to an electrical contact of said first element, and each columnar interconnect second end is diffusion bonded to an electrical contact of said second element.

8. The device of claim 1 wherein said interposer further comprises a plurality of transverse interconnects defined by etched interstices wherein said transverse interconnects electrically interconnect selected columnar interconnects as a redistribution layer.

9. The device of claim 1 wherein said interposer is formed of copper foil material.

10. The device of claim 1 wherein said columnar interconnects are spaced at a pitch of 100 microns or less.

11. The device of claim 10 wherein said columnar interconnects are spaced at a pitch of 75 microns or less.

12. The device of claim 1 wherein each columnar interconnect has a height to width aspect ratio in the range of 0.5 to 2.5.

13. An interposer for electrically and mechanically coupling a first integrated circuit package element to a second integrated circuit package element, each element having a plurality of electrical contacts, comprising:
- a plurality of etched, electrically conductive columnar interconnects defined by etched interstices between said interconnects and wherein each columnar interconnect has a first end and a second end, each end having a bonding surface; and
- a rigid supporting body formed around said interconnects, said supporting body having a first face defining first apertures exposing said bonding surfaces of said first ends wherein a bonding surface of each first end of said interconnects is adapted to be bonded and electrically connected to an electrical contact of said first element, and wherein said supporting body has a second face defining second apertures exposing said bonding surfaces of said second ends wherein a bonding surface of each second end of said interconnects is adapted to be bonded and electrically connected to an electrical contact of said second element;
- wherein said rigid supporting body comprises a cured polymer filling at least some of said interstices of said interposer between said columnar interconnects.

14. The interposer of claim 13 wherein said first element is an integrated circuit die and said second element is an integrated circuit die.

15. The interposer of claim 13 wherein said interposer further comprises a plurality of transverse interconnects defined by etched interstices wherein said transverse interconnects electrically interconnect selected columnar interconnects as a redistribution layer.

16. The interposer of claim 13 wherein said interposer is formed of an etched copper foil material.

17. The interposer of claim 13 wherein said columnar interconnects are spaced at a pitch of 100 microns or less.

18. The interposer of claim 17 wherein said columnar interconnects are spaced at a pitch of 75 microns or less.

19. The interposer of claim 13 wherein each columnar interconnect has a height to width aspect ratio in the range of 0.5 to 2.5. 28.

* * * * *